(12) United States Patent
Kim et al.

(10) Patent No.: US 11,744,137 B2
(45) Date of Patent: Aug. 29, 2023

(54) APPARATUS AND METHOD FOR DISPLAY MANUFACTURING

(71) Applicant: SAMSUNG DISPLAY CO., LTD., Yongin-si (KR)

(72) Inventors: Changmok Kim, Yongin-si (KR); Youngseo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 71 days.

(21) Appl. No.: 17/033,732

(22) Filed: Sep. 26, 2020

(65) Prior Publication Data
US 2021/0296623 A1 Sep. 23, 2021

(30) Foreign Application Priority Data
Mar. 18, 2020 (KR) .................. 10-2020-0033306

(51) Int. Cl.
| | |
|---|---|
| *H01L 51/56* | (2006.01) |
| *H10K 71/00* | (2023.01) |
| *H10K 50/844* | (2023.01) |
| *H10K 59/12* | (2023.01) |

(52) U.S. Cl.
CPC ........... *H10K 71/00* (2023.02); *H10K 50/844* (2023.02); *H10K 59/12* (2023.02); *H10K 59/1201* (2023.02); *H10K 71/861* (2023.02)

(58) Field of Classification Search
CPC ............ H01L 2251/568; H01L 51/001; H01L 51/5253; H01L 2227/323; H01L 27/3258; H01L 51/56; H01L 2251/5253; H10K 59/1201; H10K 59/122; H10K 71/8861
See application file for complete search history.

(56) References Cited

U.S. PATENT DOCUMENTS

| | | | |
|---|---|---|---|
| 7,767,498 B2 | 8/2010 | Moro et al. | |
| 9,559,338 B2 | 1/2017 | Ma et al. | |
| 9,837,640 B2* | 12/2017 | Hayashida | .............. H01L 51/56 |
| 2004/0096993 A1* | 5/2004 | Kuo | .................. H01L 51/56 438/10 |
| 2006/0079040 A1* | 4/2006 | Tanaka | ............ H01L 21/02505 438/149 |
| 2006/0144276 A1* | 7/2006 | MacPherson | .......... H10K 59/35 101/485 |
| 2010/0164375 A1* | 7/2010 | Kajiyama | ............. H10K 59/12 445/2 |
| 2019/0058161 A1 | 2/2019 | Song et al. | |
| 2020/0035448 A1* | 1/2020 | He | .................... H01J 37/28 |
| 2022/0149330 A1* | 5/2022 | Kishimoto | ............ H05B 33/10 |

* cited by examiner

*Primary Examiner* — Caridad Everhart
(74) *Attorney, Agent, or Firm* — F. Chau & Associates, LLC

(57) ABSTRACT

An apparatus for manufacturing a display device and a method of manufacturing the display device are provided. The apparatus for manufacturing the display device includes: a mounting unit, on which a display substrate may be arranged; an inspection unit movably arranged on the mounting unit and configured to inspect whether or not an organic encapsulation layer of the display substrate is defective; and a repair unit movably arranged on the mounting unit and configured to supply an organic material to a defective portion of the organic encapsulation layer, or to remove at least a portion of the defective portion of the organic encapsulation layer.

25 Claims, 16 Drawing Sheets

APPARATUS AND METHOD FOR DISPLAY MANUFACTURING

CROSS-REFERENCE TO RELATED APPLICATION

This application claims priority under 35 U.S.C. § 119 to Korean Patent Application No. 10-2020-0033306, filed on Mar. 18, 2020, in the Korean Intellectual Property Office, the disclosure of which is incorporated by reference herein in its entirety.

FIELD

The present disclosure relates to display devices, and more particularly, to an apparatus for manufacturing a display device and a method of manufacturing the display device.

DISCUSSION OF RELATED ART

Electronic devices based on mobility have become widely used. Electronic devices based on mobility, such as mobile phones, tablet personal computers (PCs), have also become more broadly used in recent times.

Such mobile electronic devices include display devices to provide visual information to a user, such as an image or a video, in order to support various functions. Recently, as various components for driving a display device have been miniaturized, the importance of the display device for an electronic device has continually increased, and a structure to bend a display device that is flat to have a certain angle has been developed.

When manufacturing such a display device, various layers may be formed. Here, the performance of the manufactured display device may be degraded, such as due to impurities or grooves in some of the layers. display devices having these defects may be discarded, and thus, a manufacturing yield rate may be decreased.

SUMMARY

During a process of forming an organic layer of an encapsulation layer, impurities and/or grooves may occur in the organic layer; and an inorganic layer, after being formed on the organic layer, may be damaged or the shielding effect of the inorganic layer rendered ineffectual. Exemplary embodiments of the present disclosure may provide an apparatus for manufacturing a display device and a method of manufacturing the display device, which allow uniform formation of an inorganic layer on an organic layer and prevention of damage to the organic layer after the inorganic layer is formed.

Exemplary embodiments will be set forth in the description which follows, and other embodiments will be apparent from the description and/or may be learned by practice of the presented embodiments of the disclosure.

According to an exemplary embodiment, an apparatus for manufacturing a display device includes: a mounting unit, on which a display substrate may be arranged; an inspection unit movably arranged on the mounting unit and configured to inspect whether or not an organic encapsulation layer of the display substrate is defective; and a repair unit movably arranged on the mounting unit and configured to supply an organic material to a defective portion of the organic encapsulation layer, or to remove at least a portion of the defective portion of the organic encapsulation layer.

The inspection unit may further be configured to detect a three-dimensional shape of a defect of the organic encapsulation layer.

The repair unit may further be configured to supply the organic material to the defective portion of the organic encapsulation layer so as to adjust a taper angle of the defective portion of the organic encapsulation layer.

The repair unit may further be configured to remove the defective portion of the organic encapsulation layer, the defective portion protruding from a surface of the organic encapsulation layer.

The inspection unit and the repair unit may be movable in a first direction and a second direction.

The repair unit may include a slit coater configured to supply the organic material or an impurity remover configured to remove the defective portion protruding from the organic encapsulation layer.

According to an exemplary embodiment, a method of manufacturing a semiconductor device includes: mounting a semiconductor substrate, on which an organic encapsulation layer is arranged; inspecting whether or not the organic encapsulation layer is defective; and supplying an organic material to a defective portion of the organic encapsulation layer.

The method may further include forming an inorganic encapsulation layer on the organic encapsulation layer.

The defective portion may have a shape, in which the defective portion protrudes from a surface of the organic encapsulation layer.

The method may further include adjusting a taper angle formed by the surface of the organic encapsulation layer and an outer surface of the defective portion, by supplying the organic material to the defective portion protruding from the surface of the organic encapsulation layer.

The defective portion may have a form of a groove dented from a surface of the organic encapsulation layer.

The method may further include supplying the organic material to the defective portion to make the surface of the organic encapsulation layer and a surface of the defective portion coplanar.

The method may further include controlling, according to a shape of the groove, an amount of the organic material supplied to the groove.

The organic material may include the same material as the organic encapsulation layer.

According to an exemplary embodiment, a method of manufacturing a display device includes: mounting a display substrate, on which an organic encapsulation layer is arranged; inspecting whether or not impurities protrude from a surface of the organic encapsulation layer; and removing a protruding portion of the impurities, from the surface of the organic encapsulation layer.

The method may further include forming an inorganic encapsulation layer on the organic encapsulation layer.

An upper surface of the impurities and an upper surface of the organic encapsulation layer may be coplanar.

The method may further include coating the impurities with an organic material.

The organic material may include the same material as the organic encapsulation layer.

A portion of the impurities may be inserted into the organic encapsulation layer.

According to an exemplary embodiment, a manufacturing apparatus includes: an alignment stage configured to receive a semiconductor substrate; an image sensor movably arranged on the alignment stage and configured to detect a defect in an encapsulation layer disposed on the semiconductor substrate; and a repair actuator movably arranged on the alignment stage and configured to repair the detected defect in the encapsulation layer.

The apparatus may include an inkjet actuator configured to form the encapsulation layer by depositing an encapsulating layer of material on the semiconductor substrate. The alignment stage may include at least one linear actuator configured to move in a direction based on a crystal orientation of at least one of the semiconductor substrate or the encapsulation layer.

The repair actuator may include an impurity remover configured to remove a portion of the encapsulation layer at a location of the defect. The repair actuator may include a slit coater configured to supply a repair material at a location of the defect within the encapsulation layer.

These and other general and specific embodiments may be implemented by using a system, a method, a computer program, or a combination of the system, the method, and the computer program, without limitation.

BRIEF DESCRIPTION OF THE DRAWINGS

The above and other exemplary embodiments of the present disclosure will be more apparent from the following description taken in conjunction with the accompanying drawings, in which.

DETAILED DESCRIPTION

Figure 1:
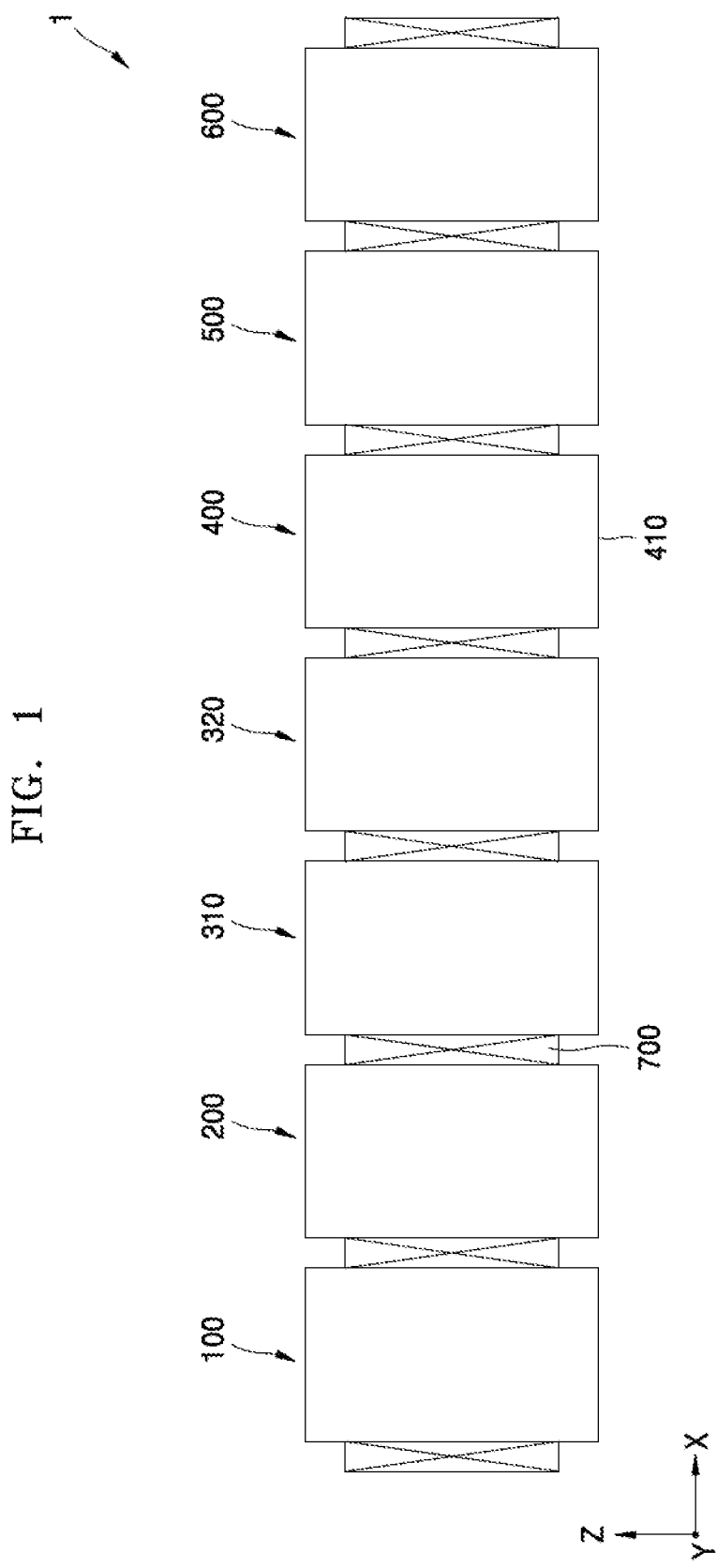
FIG. 1 is a schematic system diagram illustrating a front view of an apparatus for manufacturing a display device, according to an embodiment.

Reference will now be made in detail to exemplary embodiments, examples of which are illustrated in the accompanying drawings, wherein like reference numerals may refer to like elements throughout. In this regard, embodiments may have different forms and should not be construed as being limited to the descriptions set forth herein. Accordingly, the embodiments are merely presented and described below by way of example, with reference to the figures, to explain aspects of the present disclosure. As used herein, the term "and/or" includes any and all combinations of one or more of the associated listed items. Throughout the disclosure, expressions of the pattern "at least one of a, b or c" may indicate only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof, will become apparent by referring to the drawings and embodiments described in detail below. However, the disclosure is not limited to the embodiments disclosed hereinafter, and may be realized in various forms.

Hereinafter, embodiments of the disclosure will be described in detail by referring to the accompanying drawings. In descriptions with reference to the drawings, the same reference numerals may be given to components that are the same or substantially the same, and descriptions thereof need not be repeated.

As used herein, the singular forms "a," "an," and "the" are intended to include the plural forms as well, unless the context clearly indicates otherwise.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings may be arbitrarily illustrated for convenience of explanation, embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
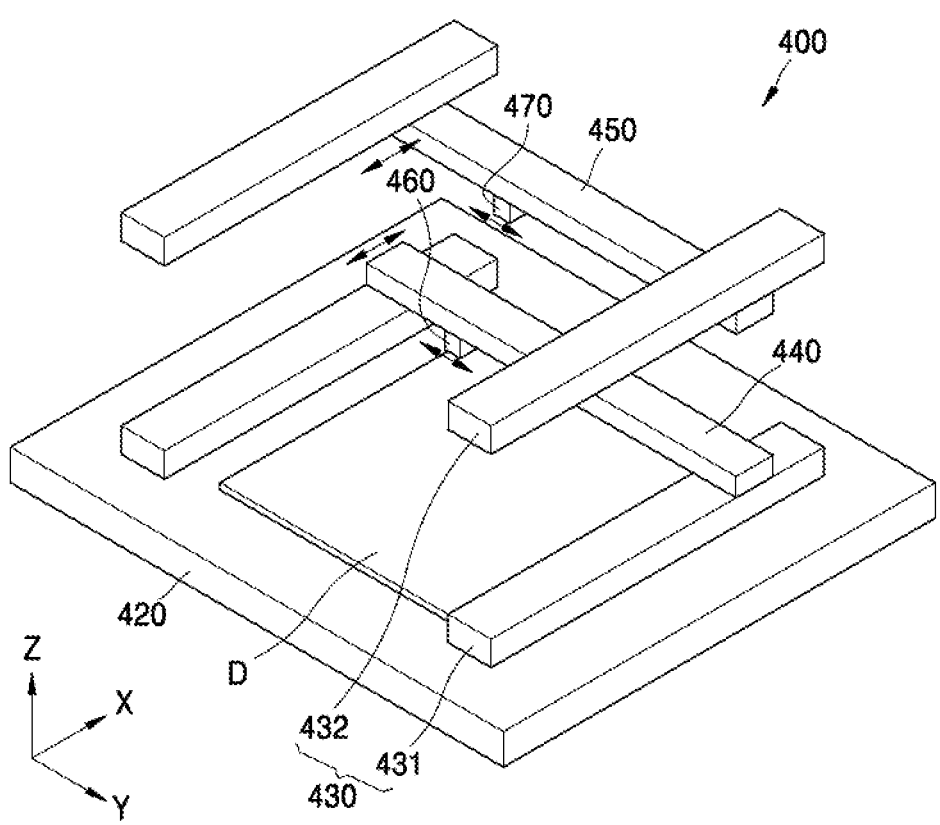
FIG. 2 is a schematic system diagram illustrating a perspective view of a portion of the apparatus for manufacturing the display device illustrated in FIG. 1.

FIG. 1 illustrates a front view of an apparatus 1 for manufacturing a display device, according to an embodiment. FIG. 2 illustrates a perspective view of a portion of the apparatus 1 for manufacturing the display device illustrated in FIG. 1.

Referring to FIGS. 1 and 2, the apparatus 1 for manufacturing the display device may include a loading portion 100, a first processing portion 200, a second processing portion 310, a third processing portion 320, a fourth processing portion 400, a fifth processing portion 500, an unloading portion 600, and an opening and closing portion 700.

Figure 3:
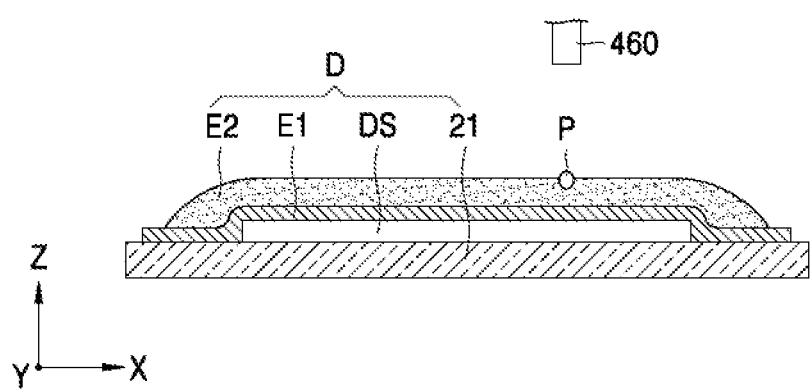
FIG. 3 is a hybrid structural diagram illustrating a cross-sectional view for describing a method of manufacturing a display device, according to an embodiment.

The loading portion 100 may be connected to the outside of the apparatus 1 for manufacturing the display device and may be supplied, from the outside, with a substrate 21 of FIG. 3, on which a display portion DS is arranged. The loading portion 100 may be connected to the outside by being connected to the opening and closing portion 700 described above.

The first processing portion 200 may form a first inorganic encapsulation layer on the display portion DS. Here, the first processing portion 200 may form the first inorganic encapsulation layer on the display portion DS by using a chemical vapor deposition method.

The second and third processing portions 310 and 320 may form a first organic encapsulation layer on the first inorganic encapsulation layer. In detail, the second processing portion 310 may supply an organic material on the first inorganic encapsulation layer. Here, the second processing portion 310 may supply the organic material on the first inorganic encapsulation layer by using an inkjet method, for example. The third processing portion 320 may cure the organic material on the first inorganic encapsulation layer. Here, the third processing portion 320 may supply heat, ultraviolet (UV) rays, or the like to the organic material.

The second and third processing portions 310 and 320 described above may be connected to each other via the opening and closing portion 700. According to an embodiment, the second and third processing portions 310 and 320 may be integrally formed. Alternatively, each of the second and third processing portions 310 and 320 may be arranged in a divided space in one chamber. Hereinafter, for convenience of explanation, a case where the second processing portion 310 and the third processing portion 320 are separated from each other via the opening and closing portion 700 will be primarily described in detail.

The fourth processing portion 400 may determine whether the first organic encapsulation layer formed through the second and third processing portions 310 and 320 is defective or not. In this case, the fourth processing portion 400 may repair a defective portion of the first organic encapsulation layer, in addition to determining whether the first organic encapsulation layer is defective or not. According to an embodiment, the fourth processing portion 400 may determine whether or not the first organic encapsulation layer is defective, and in terms of the repairing of the defective portion of the first organic encapsulation layer, a display substrate D of FIG. 3 may be returned to the second and third processing portions 310 and 320 so that the defective portion of the first organic encapsulation layer may be repaired by the second and third processing portions 310 and 320. Hereinafter, for convenience of explanation, a case where the fourth processing portion 400 may determine whether or not the first organic encapsulation layer is defective and may repair the defective portion of the first organic encapsulation layer will be primarily described in detail.

The fourth processing portion 400 may include a chamber 410 of FIG. 1, a stage 420, a guide unit 430, a first gantry 440, a second gantry 450, an inspection unit 460, and the repair unit 470 of FIG. 2.

The chamber 410 may be connected to the other processing portions via the opening and closing portion 700 of FIG. 1. The chamber 410 may have an inner space, and may be connected to an additional pressure adjusting unit, such as a pump, or the like.

The stage 420 may be arranged in the chamber 410 and the display substrate D may be mounted on the stage 420. Here, the stage 420 may include a lift pin configured to ascend or descend for the display substrate D to be mounted on the stage 420, when the display substrate D is supplied. Also, the stage 420 may also include an electrostatic chuck or an adhesive chuck configured to fix the display substrate D not to be movable after the display substrate D is mounted on the stage 420. The stage 420 may include a UVW coordinate system and/or an XYZ coordinate system alignment stage that finely adjusts a location of the display substrate D after the display substrate D is arranged on the stage 420. Here, for example, an alignment stage using the UVW coordinate system may be used to match the crystal alignment structure of the substrate, organic and/or inorganic layers.

The guide unit 430 may be arranged on the stage 420 or the chamber 410. Here, the guide unit 430 may include a first guide unit 431 and a second guide unit 432 that are arranged to be apart from each other. The first guide unit 431 may be arranged on the stage 420 or the chamber 410 and the second guide unit 432 may be arranged to be apart from the first guide unit 431 in a longitudinal direction (for example, a Z-axis direction in FIG. 1). Here, the second guide unit 432 may be fixed on an upper surface of the chamber 410 or may be connected to another structure connected to the chamber 410.

The first gantry 440 may be arranged on the first guide unit 431 to be linearly movable. Here, the first guide unit 431 and the first gantry 440 may be connected to each other via the form of a linear motor. For example, a driving portion, such as an electromagnet, may be arranged on the first guide unit 431, and a moving block coupled to the first guide unit 431 may be arranged on the first gantry 440. Also, a permanent magnet, or the like, may be arranged on the moving block. The second gantry 450 may be arranged on the second guide unit 432 to be linearly movable. Here, the second guide unit 432 and the second gantry 450 may be connected to each other via the form of a linear motor. The second guide unit 432 may be the same or substantially the same as the first guide unit 431.

The first guide unit 431 and the second guide unit 432 described above may be arranged in various directions. For example, the first and second guide units 431 and 432 may be arranged in a first direction (for example, an X-axis direction in FIG. 2). According to an embodiment, the first and second guide units 431 and 432 may be arranged in a second direction (for example, a Y-axis direction in FIG. 2). According to an embodiment, one of the first and second guide units 431 and 432 may be arranged in the first direction and the other may be arranged in the second direction. Hereinafter, for convenience of explanation, a case where the first and second guide units 431 and 432 are arranged in the first direction will be primarily described in detail.

The first gantry 440 may be arranged on the first guide unit 431 and may linearly move in a longitudinal direction (for example, the X-axis direction in FIG. 2) of the first guide unit 431. The second gantry 450 may be arranged to face the first gantry 440 and may linearly move in a longitudinal direction (for example, the X-axis direction in FIG. 2) of the second guide unit 432.

The inspection unit 460 may be movably arranged on the first gantry 440. For example, the inspection unit 460 may linearly move in a longitudinal direction (for example, the Y-axis direction in FIG. 2) of the first gantry 440. In the case described above, the inspection unit 460 may be movable in at least one of the first and second directions. Here, an additional driving portion that allows linear movement of the inspection unit 460 may be arranged on the first gantry 440 or the inspection unit 460. The driving portion may include a cylinder, a linear motor, or the like. The driving portion may also include a ball screw and a motor which are connected to the inspection unit 460.

The inspection unit 460 may detect a defective portion arranged on the display substrate D. For example, the inspection unit 460 may include an automated optical inspection (AOI) device. Here, the inspection unit 460 may capture the display substrate D and may identify whether there are aspects in a captured image of the display substrate D, which are different from pre-set data, such as a distorted pattern or a black spot or may identify whether there are different aspects between areas of the display substrate D. The inspection unit 460 may, based on a result of the identification, detect a defective portion of the display substrate D.

After the inspection unit 460 may identify the defective portion as described above, the inspection unit 460 may inspect the defective portion in greater detail. For example, the inspection unit 460 may calculate the defective portion from the whole image of the display substrate D, and then, may move to a coordinate of the calculated defective portion and enlarge and inspect the defective portion.

The repair unit 470 may be connected to the second gantry 450 to be linearly movable. Here, the repair unit 470 may include an inkjet nozzle (or a slit coater). The repair unit 470 may supply an organic material to the defective portion of the display substrate D.

The repair unit 470 and the second gantry 450 described above may be connected to each other, similarly as the first gantry 440 and the inspection unit 460 described above.

The fifth processing portion 500 may form a second inorganic encapsulation layer on the first organic encapsulation layer. Here, the fifth processing portion 500 may form the second inorganic encapsulation layer by using the same or substantially the same method as the first processing portion 200.

The unloading portion 600 may temporarily store or carry a display device 20 to the outside, the display device 20 having been manufactured after the formation of the second inorganic encapsulation layer.

The opening and closing portion 700 may be arranged between the loading portion 100 and the first processing portion 200, between each of the first through fifth processing portions 200, 310, 320, 400, and 500, between the fifth processing portion 500 and the unloading portion 600, at an entrance of the loading portion 100, and at an exit of the unloading portion 600. Here, the opening and closing portion 700 may be formed in the form of a gate valve and may connect or disconnect components. That is, the opening and closing portion 700 may be opened while the display substrate D is moved and may be closed after the display substrate D is moved.

The apparatus 1 for manufacturing the display device may include a carrier configured to move the display substrate D from the loading portion 100 to the unloading portion 600. The carrier may be arranged at a rail protruding from the loading portion 100 to the unloading portion 600 and may move the display substrate D along the rail.

With regard to an operation of the apparatus 1 for manufacturing the display device, the substrate 21, on which the display portion DS is arranged, may be supplied to the loading portion 100 and then may be transported to the first processing portion 200. The first processing portion 200 may form the first inorganic encapsulation layer on the display portion DS.

When the substrate 21 is transported to the second processing portion 310, the second processing portion 310 may coat the first inorganic encapsulation layer with the organic material. Thereafter, the substrate 21 may be transported to the third processing portion 320, and the third processing portion 320 may cure the organic material to form the first organic encapsulation layer.

The display substrate D may be transported to the fourth processing portion 400. Here, the fourth processing portion 400 may determine whether there is a defect on the first organic encapsulation layer and may repair a defective portion. Here, a repairing method will be described in detail below.

The display substrate D having been repaired by the fourth processing portion 400 may be transported from the fourth processing portion 400 to the fifth processing portion 500, and the fifth processing portion 500 may form the second inorganic encapsulation layer on the first organic encapsulation layer, to manufacture a display device.

The display device may be transported from the fifth processing portion 500 to the unloading portion 600. Thereafter, the display device may be temporarily stored in the unloading portion 600, and then, may be taken to the outside from the unloading portion 600.

An exemplary embodiment apparatus 1 may include an alignment stage configured to receive a semiconductor substrate; an image sensor movably arranged on the alignment stage and configured to detect a defect in an encapsulation layer disposed on the substrate; and a repair driver or actuator movably arranged on the alignment stage and configured to repair the detected defect in the encapsulation layer. The image sensor may sense light in the visual, ultraviolet and/or infrared electromagnetic frequency ranges.

The apparatus 1 may include an inkjet nozzle or actuator configured to form the encapsulation layer by depositing an encapsulating layer of material on the substrate. The alignment stage may include at least one linear actuator configured to move in a direction based on a crystal orientation of at least one of the substrate or the encapsulation layer. The repair actuator may include an impurity remover configured to remove a portion of the encapsulation layer at a location of the defect. The repair actuator may include a slit coater configured to supply a repair material at a location of the defect within the encapsulation layer.

As described above, embodiments of the apparatus 1 for manufacturing the display device may identify a defective portion and repair the defective portion, in a process of manufacturing the display device. The apparatus 1 for manufacturing the display device may prevent damage or fracture to the second inorganic encapsulation layer, such as damage or fracture caused by defects of the first organic encapsulation layer, in a process of manufacturing the display device.

FIG. 3 illustrates a cross-sectional view for describing a method of manufacturing a display device, according to an embodiment.

Referring to FIG. 3, the display substrate D may be manufactured in the first processing portion 200 through the third processing portion 320, illustrated in FIG. 1. Thereafter, the fourth processing portion 400 may inspect whether or not a first organic encapsulation layer E2 of the display substrate D is defective. Here, defects of the first organic encapsulation layer E2 may include a case where impurities P are present in the first organic encapsulation layer E2 or a case where grooves are present in a surface of the first organic encapsulation layer E2. Hereinafter, the case where the impurities P are present in the first organic encapsulation layer E2 will be primarily described in detail, but embodiments are not limited thereto.

For example, the first organic encapsulation layer E2 is formed on a first inorganic encapsulation layer E1 arranged on the display portion DS. After the first organic encapsulation layer E2 is formed, the first organic encapsulation layer E2 is cured. When the display substrate D is moved, impurities P are more likely to fall down onto, or may otherwise be present in, the first organic encapsulation layer E2.

In this case, the impurities P may be disposed on a surface of the first organic encapsulation layer E2, or a portion of the impurities P may be present in the first organic encapsulation layer E2 and the other portion of the impurities P may protrude from the surface of the first organic encapsulation layer E2.

Figure 6:
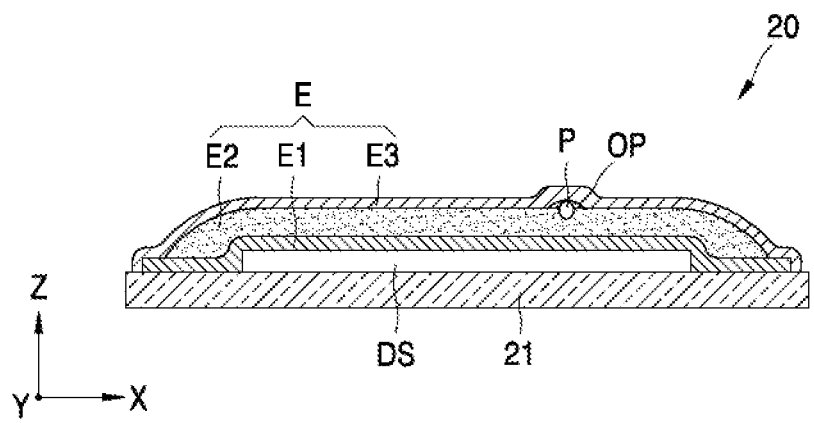
FIG. 6 is a structural diagram illustrating a cross-sectional view for describing a method of manufacturing a display device, according to an embodiment.

When, as described above, at least a portion of the impurities P protrudes from the surface of the first organic encapsulation layer E2 and is exposed through the surface of the first organic encapsulation layer E2, a second inorganic encapsulation layer E3 of FIG. 6, which is to be formed on the first organic encapsulation layer E2, might not be formed to be flat or a portion of the second inorganic encapsulation layer E3 may protrude compared to another portion of the second inorganic encapsulation layer E3, so that the second inorganic encapsulation layer E3 may be ripped or may crack. To avoid the phenomena described above, embodiments may inspect as to the existence of the impurities P and a degree to which the impurities P protrude.

The inspection unit 460 may move in at least one of the first direction and the second direction and may inspect whether there are the impurities P on the display substrate D. Here, when the impurities P are detected in an image of the display substrate D, the image being captured by the inspection unit 460, the image of the display substrate D may have relatively dark or black spots or spotted patterns.

The inspection unit 460 may transport the captured image to a controller. Here, based on the image captured by the inspection unit 460, the controller may calculate a location of the impurities P on the display substrate D.

When the location of the impurities P is calculated, the controller may move the inspection unit 460 to an area of the display substrate D, the area including the impurities P. The controller may control the inspection unit 460 to enlarge and inspect the impurities P or the area of the display substrate D, in which the impurities P are disposed. Here, the inspection unit 460 may capture an enlarged image or may detect a size of the impurities P based on the outer circumference of the impurities P, a distance between the impurities P and a surface of the first organic encapsulation layer E2, or the like. Based on a result detected by the inspection unit 460, the controller may calculate a height by which the impurities P protrude, which is a distance between the surface of the first organic encapsulation layer E2 and an end of the impurities P, and a three-dimensional shape of a portion of the impurities P protruding from the surface of the first organic encapsulation layer E2.

Figure 4:
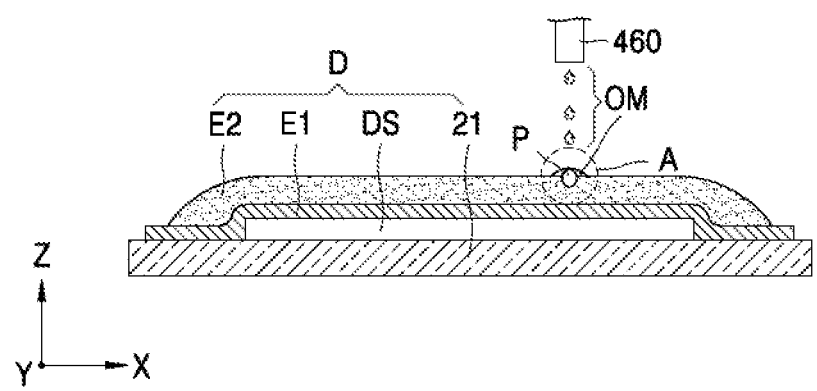
FIG. 4 is a hybrid structural diagram illustrating a cross-sectional view for describing a method of manufacturing a display device, according to an embodiment.
Figure 5:
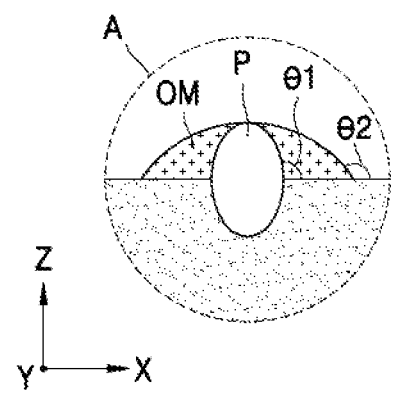
FIG. 5 is a structural diagram illustrating an enlarged cross-sectional view of an area A illustrated in FIG. 4.

FIG. 4 illustrates a cross-sectional view for describing a method of manufacturing a display device, according to an embodiment. FIG. 5 illustrates an enlarged cross-sectional view of area A illustrated in FIG. 4.

Referring to FIGS. 4 and 5, based on the calculated three-dimensional shape of the impurities P, the controller may calculate a first taper angle 81 formed by a surface of the first organic encapsulation layer E2 and a surface of the impurities P. The controller may determine whether the first taper angle 81 is equal to or less than a pre-set taper angle. When the first taper angle 81 is greater than the pre-set taper angle, the controller might not additionally repair a defective portion of the first organic encapsulation layer E2 and may control a shuttle, or the like, to move the display substrate D from the fourth processing portion 400 to the fifth processing portion 500.

However, when the first taper angle 81 is equal to or less than the pre-set taper angle, the controller may supply the area, on which the impurities P are disposed, with an organic material OM. In detail, when the organic material OM is provided by the repair unit 470, the organic material OM may be sprayed on the first organic encapsulation layer E2, on which the impurities P are disposed, thereby moving to an area around the impurities P. Here, the organic material OM may be disposed between the surface of the impurities P and the surface of the first organic encapsulation layer E2 to expose a portion of the impurities P to the outside or to completely shield the impurities P. In this case, a taper angle formed by an outer surface of an area protruding from the first organic encapsulation layer E2 and the surface of the first organic encapsulation layer E2 may be adjusted, due to the organic material OM. In detail, a second taper angle 82, which is formed by an outermost surface of the organic material OM and the surface of the first organic encapsulation layer E2 may be greater than the pre-set taper angle. In particular, the second taper angle 82 may be greater than the first taper angle 81. Moreover, the second taper angle 82 may be greater than the pre-set taper angle. In this case, an end of an area of the first organic encapsulation layer E2, the area protruding due to the organic material (OM) and the impurities P, may form a smooth curve (or slope) from the surface of the first organic encapsulation layer E2.

After the organic material OM is supplied as described above, the organic material OM may be cured. Here, methods of curing may include leaving the display substrate D such that the display substrate D may be naturally cured or curing the display substrate D by arranging an additional device, such as a UV lamp, or the like, in a fourth processing portion. According to an embodiment, the display substrate D coated with the organic material OM may be transported again to a third processing portion, to cure the organic material OM via the third processing portion.

The taper angle described above may be an angle between an outer surface of each of the organic material OM and the impurities P, and the surface of the first organic encapsulation layer E2.

FIG. 6 illustrates a cross-sectional view for describing a method of manufacturing a display device, according to an embodiment.

Referring to FIG. 6, after the defective portion of the display substrate D is repaired by supplying the organic material OM as described above, a fifth processing portion may form the second inorganic encapsulation layer E3 on the first organic encapsulation layer E2.

Here, the second inorganic encapsulation layer E3 may be formed along the surface of the first organic encapsulation layer E2. In particular, the first organic encapsulation layer E2 may provide, by adjusting various curves included in the display portion DS, a flatter surface on which the second inorganic encapsulation layer E3 is to be formed. Here, when there is a curved area or a protruding area of the surface of the first organic encapsulation layer E2, the second inorganic encapsulation layer E3 may be ripped or may crack as described above, after the second inorganic encapsulation layer E3 is formed. Alternatively, the second inorganic encapsulation layer E3 might not have a uniform thickness throughout the display substrate D, and thus, some portions of the second inorganic encapsulation layer E3 might not be effective for protection against moisture and oxygen.

Particularly, when the impurities P are disposed on the first organic encapsulation layer E2 as described above, not only an area of the surface of the first organic encapsulation layer E2, the area including the impurities P, may protrude compared to other areas of the surface of the first organic encapsulation layer E2, but also the first organic encapsulation layer E2 may have an area, the height of which is drastically different from heights of other areas, and thus, the problems described above may occur.

However, by coating the area of the surface of the first organic encapsulation layer E2, the area including the impurities P, with the organic material OM, the protruding area of the surface of the first organic encapsulation layer E2 may more smoothly climb from flat areas of the first organic encapsulation layer E2. Also, an area of the first organic encapsulation layer E2, the area contacting a bottom surface of the second inorganic encapsulation layer E3, may be prevented from having a drastically different height, as described above.

Thus, according to the method of manufacturing the display device, not only the protruding area may be removed from the surface, on which the second inorganic encapsulation layer E3 is to be formed, but also, the area having a drastically different height may be eliminated, and thus, the second inorganic encapsulation layer E3 may be more uniformly formed.

According to the method of manufacturing the display device, the display device 20 having a uniform thickness may be manufactured. Also, according to the method of manufacturing the display device, after identifying the location of the impurities P, the manufactured display device 20 may be repaired, rather than being discarded.

Figure 7:
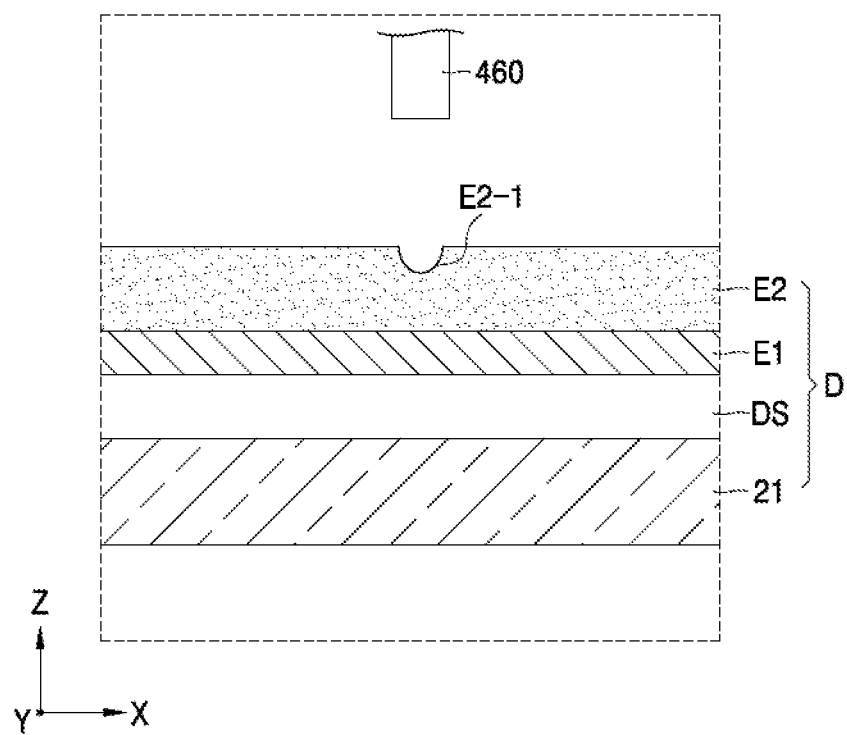
FIG. 7 is a hybrid structural diagram illustrating a cross-sectional view for describing a method of manufacturing a display device, according to an embodiment.

FIG. 7 illustrates a cross-sectional view for describing a method of manufacturing a display device, according to an embodiment.

Referring to FIG. 7, when the display substrate D is supplied to a fourth processing portion, the inspection unit 460 may inspect whether or not the first organic encapsulation layer E2 is defective. Here, a defective portion of the first organic encapsulation layer E2 may be in the shape of a groove E2-1.

The inspection unit 460 may inspect a surface of the first organic encapsulation layer E2. Here, a controller may determine a location of the groove E2-1 from the surface of the first organic encapsulation layer E2, based on a result of the inspection performed by the inspection unit 460. For example, a size of a pattern formed at a portion of the display substrate D, the portion including the groove E2-1, may be smaller than a size of a pattern formed at other portions of the display substrate D, the other portions not including the groove E2-1, in a captured image of the display substrate D. Alternatively, a distance between patterns formed at a portion of the display substrate D, the portion including the groove E2-1, may be different from a distance between patterns formed at other portions of the display substrate D, the other portions not including the groove E2-1. These patterns may be shown in an image generated by capturing the display substrate D by the inspection unit 460, because an opening of a pixel-defining layer 29 of FIG. 16, to be described below, is uniformly formed on the display substrate D.

When the location of the groove E2-1 is identified as described above, the controller may locate the inspection unit 460 at the location of the groove E2-1. Here, the controller may linearly move the first gantry 440 illustrated in FIG. 2 on the first guide unit 431 and may linearly move the inspection unit 460 on the first gantry 440.

When the location of the inspection unit 460 corresponds to the location of the groove E2-1 as described above, the controller may control the inspection unit 460 to enlarge and inspect the groove E2-1. Here, the inspection unit 460 may inspect a depth of the groove E2-1, which is a distance between a surface of the first organic encapsulation layer E2 and an inner surface of the groove E2-1. Here, the inspection unit 460 may completely inspect the depth of the groove E2-1 in terms of a three-dimensional shape of the groove E2-1. The controller may calculate the three-dimensional shape of the groove E2-1 based on inspected data generated by the inspection unit 460. Also, the controller may calculate a volume of the groove E2-1 based on the three-dimensional shape of the groove E2-1.

Figure 8:
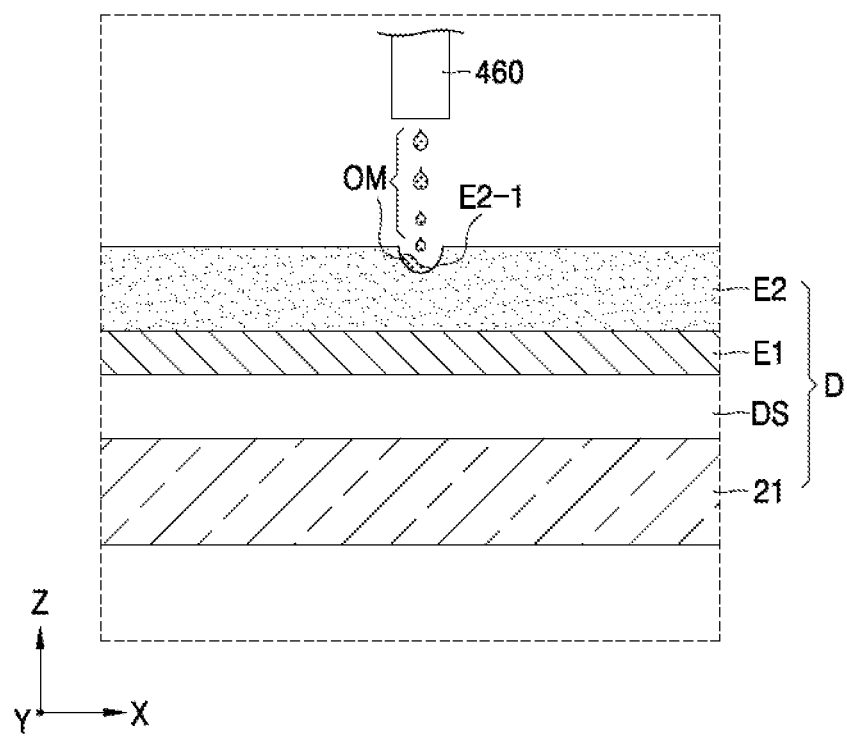
FIG. 8 is a hybrid structural diagram illustrating a cross-sectional view for describing a method of manufacturing a display device, according to an embodiment.

FIG. 8 illustrates a cross-sectional view for describing a method of manufacturing a display device, according to an embodiment.

Referring to FIG. 8, a controller may move the repair unit 470 to locate the repair unit 470 to correspond to the groove E2-1. Thereafter, the controller may control the repair unit 470 such that the organic material OM completely fills an inner space of the groove E2-1. Here, the repair unit 470 may include an inkjet nozzle to supply the organic material OM.

When the organic material OM completely fills the inner space of the groove E2-1 as described above, the organic material OM may be cured. Here, methods of curing the organic material OM may include leaving the display substrate D by a certain time lapse after the organic material OM is supplied to the groove E2-1, so that the organic material OM may be naturally dried. According to an embodiment, the organic material OM may be cured by arranging, in the repair unit 470, an additional device, such as a UV lamp, or the like, which is to supply energy to the organic material OM. According to an embodiment, the organic material OM may be supplied to the groove E2-1 by a fourth processing portion, and then, the display substrate D may be re-transported to the third processing portion 320 so that the third processing portion 320 may cure the organic material OM.

When the organic material OM is completely cured as described above, the display substrate D may be transported to a fifth processing portion.

Figure 9:
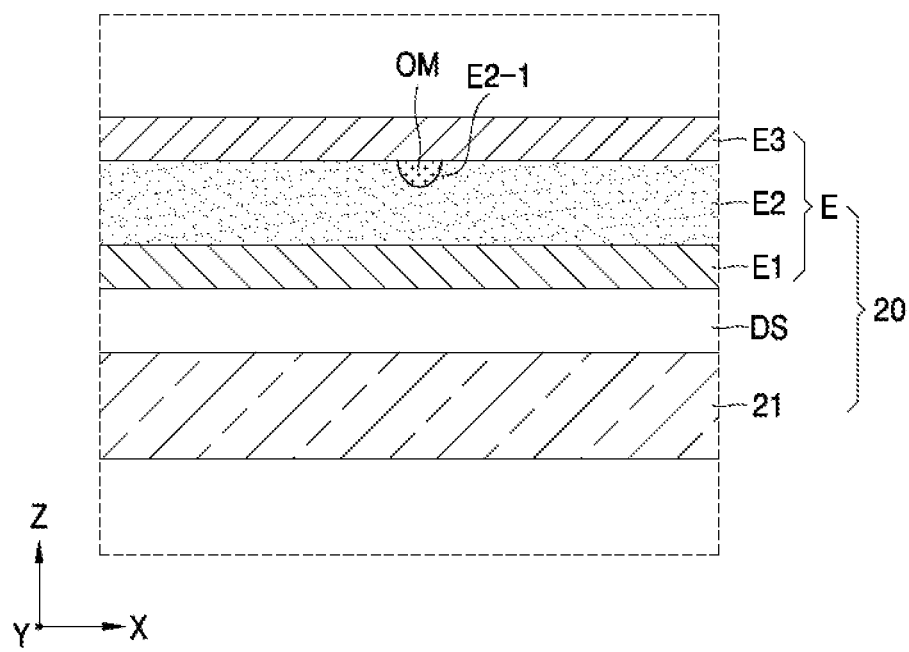
FIG. 9 is a structural diagram illustrating a cross-sectional view for describing a method of manufacturing a display device, according to an embodiment.

FIG. 9 illustrates a cross-sectional view for describing a method of manufacturing a display device, according to an embodiment.

Referring to FIG. 9, when the display substrate D is transported to a fifth processing portion, the fifth processing portion may form the second inorganic encapsulation layer E3 on the first organic encapsulation layer E2.

In this case, because the organic material OM may be inserted into the groove E2-1 and is cured, a surface of the first organic encapsulation layer E2 and the organic material OM may form a flat plane. In particular, in this case, the organic material OM may planarize the surface of the first organic encapsulation layer E2.

The second inorganic encapsulation layer E3 may be arranged on the first organic encapsulation layer E2 and the organic material OM to completely surround an outer edge of the first organic encapsulation layer E2. Here, an end of the second inorganic encapsulation layer E3 may be connected to at least one of an end of the first inorganic encapsulation layer E1 and the substrate 21, so as to completely shield the first organic encapsulation layer E2 from the outside.

When the second inorganic encapsulation layer E3 is formed as described above, the display portion DS may be completely protected from the outside via the first inorganic encapsulation layer E1, the first organic encapsulation layer E2, and the second inorganic encapsulation layer E3. Here, when there is the groove E2-1 in the first organic encapsulation layer E2 as described above, the second inorganic encapsulation layer E3 might not be flatly formed to have a uniform thickness, and thus, after the second inorganic encapsulation layer E3 is formed, the second inorganic encapsulation layer E3 may be fractured or damaged.

However, when the second inorganic encapsulation layer E3 is formed after making the surface of the first organic encapsulation layer E2 flat by filling and curing the organic material OM in the inner space of the groove E2-1, the second inorganic encapsulation layer E3 might not be damaged.

Thus, according to the method of manufacturing the display device, the manufactured display device 20 may have an increased lifespan. Also, according to the method of manufacturing the display device, defects of the manufactured display device 20 may be easily and rapidly repaired.

Figure 10:
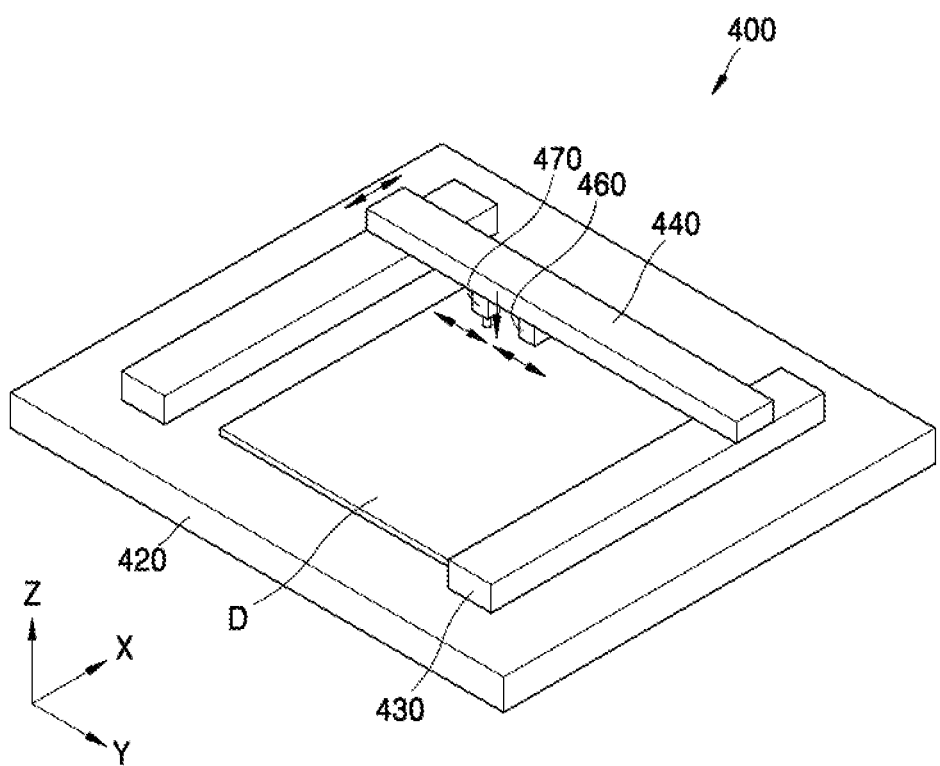
FIG. 10 is a schematic system diagram illustrating a perspective view of a portion of an apparatus for manufacturing a display device, according to an embodiment.
Figure 11:
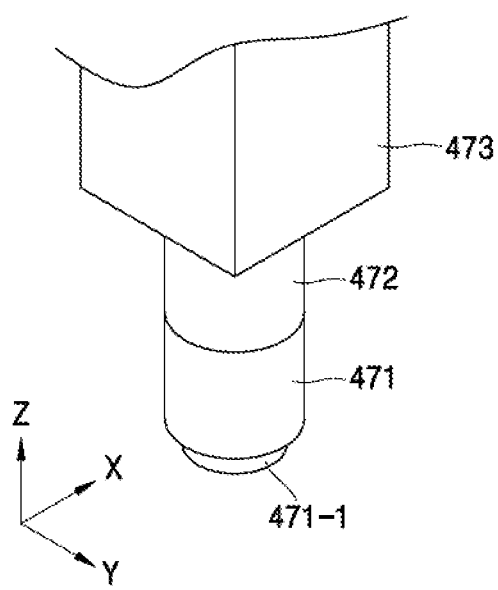
FIG. 11 is a schematic system diagram illustrating a perspective view of a repair unit illustrated in FIG. 10.

FIG. 10 illustrates a perspective view of a portion of an apparatus 1 for manufacturing the display device, according to an embodiment. FIG. 11 illustrates a perspective view of the repair unit 470 illustrated in FIG. 10.

Referring to FIG. 10, the apparatus 1 for manufacturing the display device may be substantially the same as illustrated in FIG. 1, so duplicate description may be omitted. Here, the fourth processing portion 400 may include a chamber, the stage 420, the guide unit 430, the gantry 440, the inspection unit 460, and the repair unit 470. The chamber, the stage 420, the guide unit 430, the gantry 440, and the inspection unit 460 may be the same or substantially the same as described in FIGS. 1 and 2.

The repair unit 470 may be movably connected to the gantry 440. Here, the repair unit 470 may include an impurity remover 471 and a repairing driver. According to an embodiment, in addition to the components described above, the repair unit 470 may include a nozzle to provide an organic material, as illustrated in FIG. 2.

The impurity remover 471 may remove impurities, when the impurities are exposed through a first organic encapsulation layer. Here, the impurity remover 471 may include a pad 471-1 configured to grind and remove the impurities. According to an embodiment, the impurity remover 471 may include a belt configured to rotate and to remove a protruding portion of the impurities. For example, the belt may have the form that rotates based on a Y-axis in FIG. 10. According to an embodiment, the impurity remover 471 may include a blade of a knife configured to remove the portion of the impurities that is exposed through the first organic encapsulation layer. Hereinafter, for convenience of explanation, a case where the impurity remover 471 includes the pad 471-1 will be primarily described in detail, but embodiments are not limited thereto.

The repairing driver may make the impurity remover 471 perform at least one of rotational movement or a linear movement. For example, the repairing driver may connect the impurity remover 471 with the gantry 440, to make the impurity remover 471 perform rotational movement. According to an embodiment, while the repairing driver may make the impurity remover 471 perform rotational movement, the repairing driver may make the impurity remover 471 perform ascending and descending movement based on the gantry 440. According to an embodiment, the repairing driver might not only make the impurity remover 471 perform ascending and descending movement based on the gantry 440, but also may make the impurity remover 471 perform straight line movement in X-axis and Y-axis directions in FIG. 10. Hereinafter, for convenience of explanation, a case where the repairing driver may make the impurity remover 471 perform ascending and descending movement, and the repairing driver may make the impurity remover 471 perform rotational movement, will be primarily described in detail.

The repairing driver may include a rotational driving portion 472 to rotate the impurity remover 471 and a linear driving portion 473 connected with the rotational driving portion 472. The rotational driving portion 472 and the linear driving portion 473 may be connected with each other in various forms. According to an embodiment, the rotational driving portion 472 may be connected to the gantry 440 and the linear driving portion 473 may connect the rotational driving portion 472 with the impurity remover 471. According to an embodiment, the linear driving portion 473 may be connected to the gantry 440 and the rotational driving portion 472 may connect the linear driving portion 473 with the impurity remover 471. Hereinafter, for convenience of explanation, a case where the linear driving portion 473 is connected to the gantry 440 and the rotational driving portion 472 connects the linear driving portion 473 with the impurity remover 471 will be primarily described in detail.

In the case described above, the linear driving portion 473 may adjust, at a location on which the impurities are disposed, a distance between the impurities and the impurity remover 471 or a distance between a surface of the first organic encapsulation layer and the impurity remover 471. Here, the linear driving portion 473 may include a cylinder to connect the gantry 440 with the rotational driving portion 472, or a rack gear connected to either one of the gantry 440 and the rotational driving portion 472 and a motor connected to the other one of the gantry 440 and the rotational driving portion 472. According to an embodiment, the linear driving portion 473 may include a linear motor that connects the gantry 440 with the rotational driving portion 472. The linear driving portion 473 is not limited to the structure described above. The linear driving portion 473 may include all structures and devices that connect the gantry 440 with the rotational driving portion 472 and make the rotational driving portion 472 perform linear movement.

The rotational driving portion 472 may make the impurity remover 471 perform rotational movement. Here, the rotational driving portion 472 may include a motor connected to the impurity remover 471.

The inspection unit 460 and the repair unit 470 described above may be arranged in the gantry 440. Here, the inspection unit 470 and the repair unit 470 may individually linearly move. For example, the inspection unit 460 may move in a longitudinal direction (for example, the Y-axis direction in FIG. 10) of the gantry 440. Here, the repair unit 470 might not move in the gantry 440. According to an embodiment, the inspection unit 460 and the repair unit 470 may simultaneously move. In this case, the inspection unit 460 and the repair unit 470 may be connected to one moving block. Hereinafter, for convenience of explanation, a case where the inspection unit 460 and the repair unit 470 individually linearly move will be primarily described in detail.

The apparatus 1 for manufacturing the display device described above may determine whether or not a display device is defective and may repair a defect, during a manufacturing process of the display device.

In particular, because the apparatus 1 for manufacturing the display device may repair the defect during the manufacturing process of the display device, the manufacturing process of the display device may be simplified and at the same time, the manufacturing time may be reduced.

Also, the apparatus 1 for manufacturing the display device may cope with various defects. The apparatus 1 for manufacturing the display device may identify a portion requiring a repair, through precise inspections.

Hereinafter, a method, performed by the apparatus 1 for manufacturing the display device, of repairing a defect during a manufacturing process of the display device, will be described in detail.

Figure 12:
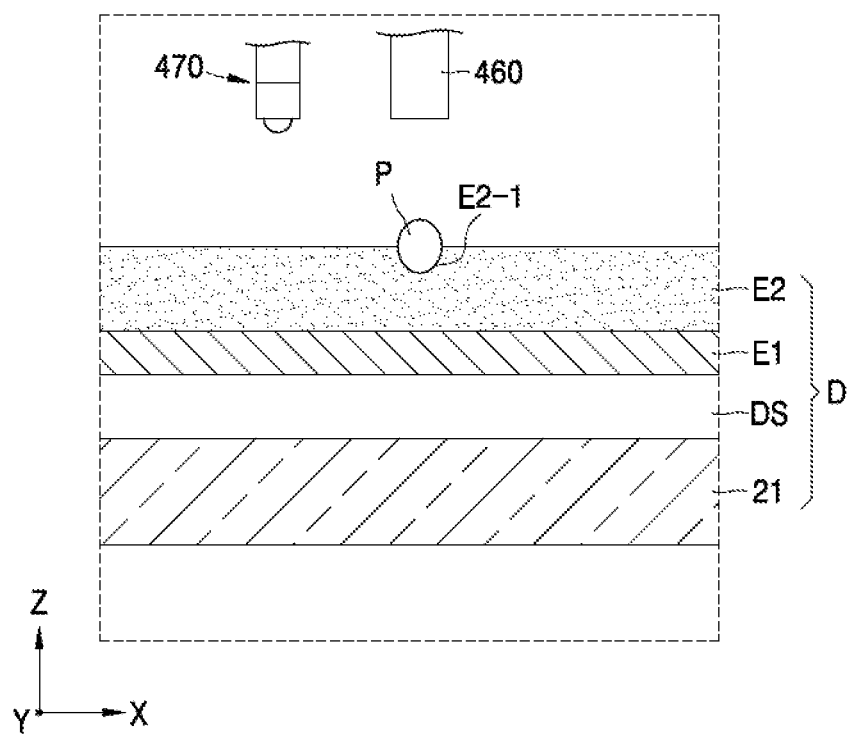
FIG. 12 is a hybrid structural diagram illustrating a cross-sectional view for describing a method of manufacturing a display device, according to an embodiment.

FIG. 12 illustrates a cross-sectional view for describing a method of manufacturing a display device, according to an embodiment.

Referring to FIG. 12, after the first organic encapsulation layer E2 is formed through a third processing portion, the inspection unit 460 may inspect whether or not there are the impurities P on the first organic encapsulation layer E2. In this case, the inspection unit 460 may move in the X-axis direction in FIG. 10, along a guide unit. Also, the inspection unit 460 may move on a gantry in the Y-axis direction in FIG. 10.

After the inspection unit 460 moves and detects whether or not there are the impurities P on the first organic encapsulation layer E2, the inspection unit 460 may detect in detail, the impurities P, and a portion of the first organic encapsulation layer E2, the portion being around the impurities P, by being arranged at a location of an area of the first organic encapsulation layer E2, the area including the impurities P.

Based on a result detected by the inspection unit 460, a controller may calculate a location of the display substrate D, the location including the impurities P, a three-dimensional shape of the impurities P, and a distance between a surface of the first organic encapsulation layer E2 and an end of the impurities P protruding from the surface of the first organic encapsulation layer E2.

Figure 13:
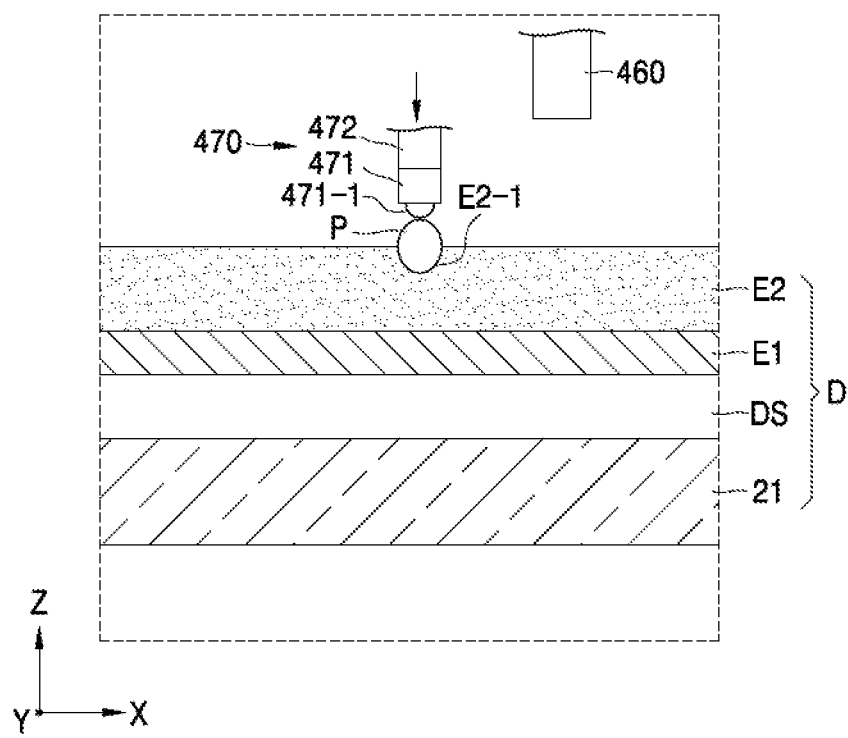
FIG. 13 is a hybrid structural diagram illustrating a cross-sectional view for describing a method of manufacturing a display device, according to an embodiment.

FIG. 13 illustrates a cross-sectional view for describing a method of manufacturing a display device, according to an embodiment.

Referring to FIG. 13, a controller may control, based on the calculated distance between the surface of the first organic encapsulation layer E2 and the end of the impurities P protruding, a linear driving portion to make the pad 471-1 contact the end of the impurities P or approach to a closest area thereto as possible.

The controller may control the rotational driving portion 472 to make the impurity remover 471 rotate. Also, the controller may control the linear driving portion to make the pad 471-1 approach close to the first organic encapsulation layer E2.

In this case, the pad 471-1 may contact the impurities P and grind the impurities P, thereby removing an area of the impurities P protruding from the first organic encapsulation layer E2. In this case, the surface of the first organic encapsulation layer E2 and the surface of the impurities P may form a flat plane. That is, the surface of the first organic encapsulation layer E2 and the surface of the impurities P may form the same plane.

This operation may be performed by the fourth processing portion 400 of FIG. 2. Also, the controller may control the linear driving portion and the rotational driving portion 472 such that the area of the impurities P protruding from the surface of the first organic encapsulation layer E2 is grounded. Here, the inspection unit 460 may transmit, to the controller, a result of monitoring a state of the grounded impurities P, and the controller may control the linear driving portion and the rotational driving portion 472 based on the result of the monitoring via the inspection unit 460.

In addition to the case described above, when the repair unit 470 includes an inkjet nozzle (or a slit coater) in addition to the impurity remover 471, the inkjet nozzle (or the slit coater) may coat the surface of the impurities P with an organic material, after the impurity remover 471 removes the impurities P. In this case, when an area, from which the impurities P are removed, is dented inwardly from the surface of the first organic encapsulation layer E2, the surface of the first organic encapsulation layer E2 may be made flat by coating the dented area with the organic material.

Also, when, as illustrated in FIG. 7, in addition to the impurities P, a groove is formed in the first organic encapsulation layer E2, the inkjet nozzle (or the slit coater) may supply the organic material to make the surface of the first organic encapsulation layer E2 flat.

In this case, the repair unit 470 and the gantry 440 may be provided in a multiple number, wherein the gantries 440 may be arranged at different heights and each repair unit 470 and the inspection unit 460 may be arranged at the gantries 440 having different heights. According to an embodiment, the repair unit 470 may be provided in a multiple number, wherein each repair unit 470 and the inspection unit 460 may be arranged at one gantry 440. According to an embodiment, the repair unit 470 and the gantry 440 may be provided in a multiple number, wherein one or more of the plurality of repair units 470 and the inspection unit 460 may be arranged at one of the plurality of gantries 440, and each of the remaining ones of the plurality of repair units 470 may be arranged at each gantry 440.

When the repair unit 470 is provided in a multiple number, one or more of the plurality of repair units 470 may include the impurity remover 471, and the remaining ones of the plurality of repair units 470 may include an inkjet nozzle (or a slit coater).

Figure 14:
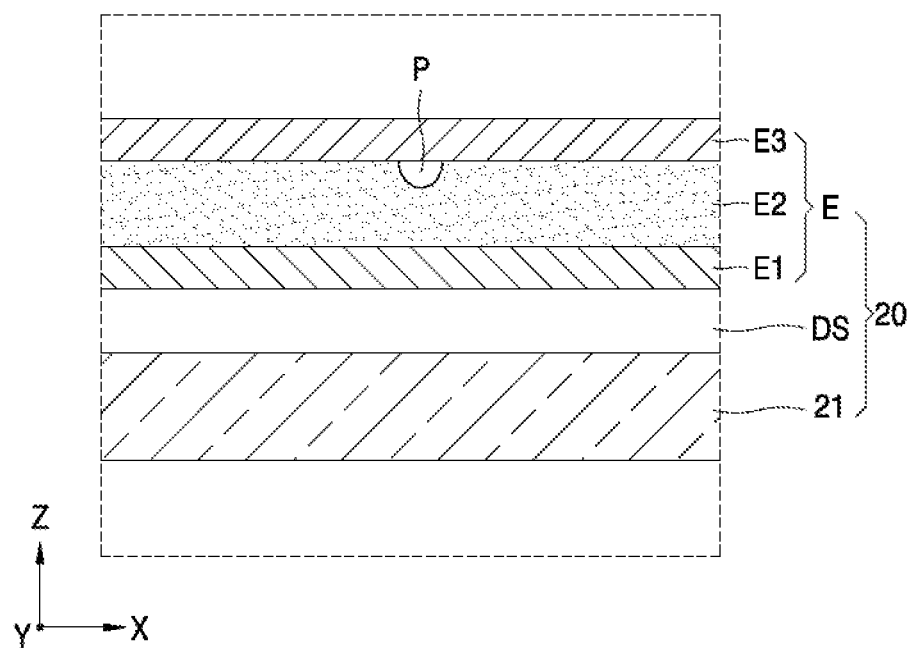
FIG. 14 is a structural diagram illustrating a cross-sectional view for describing a method of manufacturing a display device, according to an embodiment.

FIG. 14 illustrates a cross-sectional view for describing a method of manufacturing a display device, according to an embodiment.

Referring to FIG. 14, when a surface of the impurities P and a surface (or an upper plane) of the first organic encapsulation layer E2 become flat by removing an area of the impurities P, the area protruding from the first organic encapsulation layer E2, the controller may stop grinding the impurities P.

Thereafter, the display substrate D may be transported from the fourth processing portion 400 to the fifth processing portion 500. The fifth processing portion 500 may form the second inorganic encapsulation layer E3 on the first organic encapsulation layer E2. In this case, the second inorganic encapsulation layer E3 may be formed on a flat plane so as not to have a curve. In particular, after the second inorganic encapsulation layer E3 is formed, the second inorganic encapsulation layer E3 might not be floated from the surface of the first organic encapsulation layer E2 or damaged, due to the protruded area of the impurities P.

Thus, according to the method of manufacturing the display device, the manufactured display device 20 may have an increased lifespan. Also, according to the method of manufacturing the display device, defects of the manufactured display device 20 may be easily and rapidly repaired.

Figure 15:
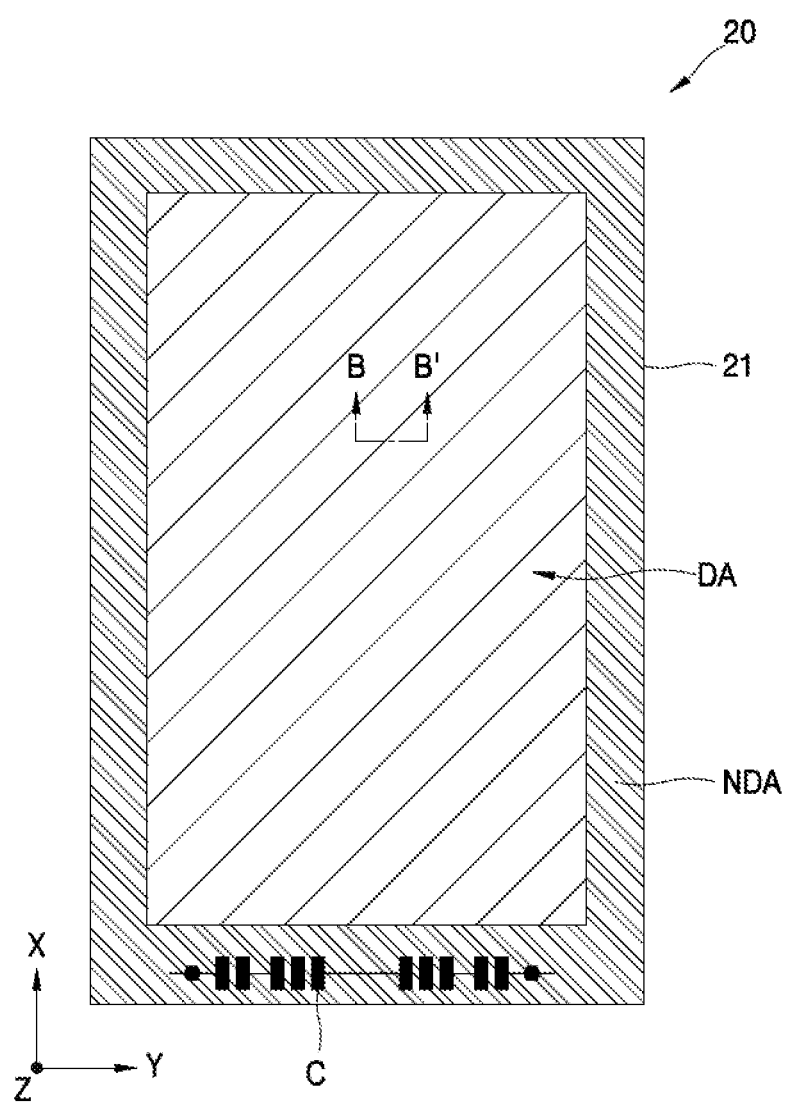
FIG. 15 is a schematic block diagram illustrating a plan view of a display device manufactured by using an apparatus for manufacturing a display device, according to embodiments.
Figure 16:
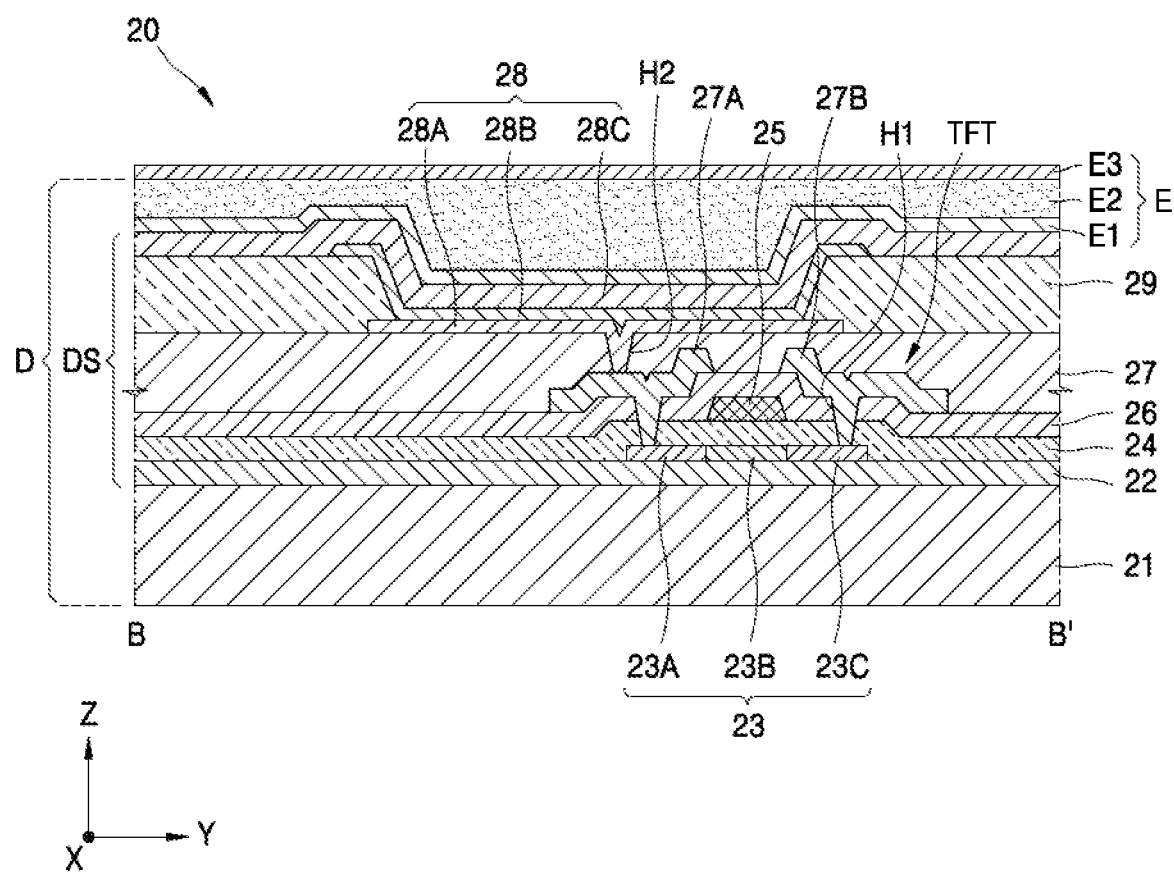
FIG. 16 is a structural diagram illustrating a cross-sectional view of the display device of FIG. 15, taken along a line B-B' of FIG. 15.

FIG. 15 illustrates a plan view of the display device 20 manufactured by using the apparatus 1 for manufacturing the display device, according to an embodiment. FIG. 16 illustrates a cross-sectional view of the display device 20 of FIG. 15, the display device 20 being taken along line B-B' of FIG. 15.

Referring to FIGS. 15 and 16, the display device 20 may define a display area D and a non-display area NDA outside the display area D on the substrate 21. A light emission portion may be arranged in the display area D and power interconnections, or the like. may be arranged in the non-display area NDA. Also, a terminal pad portion C may be arranged in the non-display area NDA.

The display device 20 may include the substrate 21, the display portion DS, and an encapsulation layer E. Here, the display portion DS may include a thin film transistor TFT, a passivation layer 27, and an organic light emitting device (OLED) 28. The substrate 21, the display portion DS, and a portion of the encapsulation layer E may form the display substrate D.

The substrate 21 may include glass or polymer resins. The polymer resins may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 21 including the polymer resins may have flexible, rollable, or bendable properties. The substrate 21 may have a multi-layered structure including a layer including the polymer resins described above and an inorganic layer.

The thin film transistor TFT may be formed on the substrate 21, the passivation layer 27 may be formed to cover the thin film transistor TFT, and the OLED 28 may be formed on the passivation layer 27.

A buffer layer 22 including an organic compound and/or an inorganic compound may further be formed on an upper surface of the substrate 21. The buffer layer 22 may include $SiO_x(x \geq 1)$ or $SiN_x(x \geq 1)$.

An active layer 23 arranged in a certain pattern may be formed on the buffer layer 22, and the active layer 23 may be buried by a gate insulating layer 24. The active layer 23 may have a source area 23A and a drain area 23C, and may further have a channel area 23B therebetween.

The active layer 23 may be formed to contain various materials. For example, the active layer 23 may contain an inorganic semiconductor material, such as amorphous silicon or crystalline silicon. As another example, the active layer 23 may contain an oxide semiconductor. As another example, the active layer 23 may contain an organic semiconductor material. However, hereinafter, a case in which the active layer 23 includes amorphous silicon will be primarily described in detail, for convenience of explanation.

The active layer 23 may be formed by forming an amorphous silicon layer on the buffer layer 22, forming a polycrystalline silicon layer by crystallizing the amorphous silicon layer, and patterning the polycrystalline silicon layer. The source area 23A and the drain area 23C of the active layer 23 may be doped with impurities, according to types of thin film transistors, for example, a driving thin film transistor, a switching thin film transistor, or the like.

A gate electrode 25 corresponding to the active layer 23 and an interlayer insulating layer 26 burying the gate electrode 25 may be formed on an upper surface of the gate insulating layer 24.

Also, a contact hole H1 may be formed in the interlayer insulating layer 26 and the gate insulating layer 24, and then, a source electrode 27A and a drain electrode 27B may be formed on the interlayer insulating layer 26 to contact the source area 23A and the drain area 23C, respectively.

A passivation layer 27 may be formed above the thin film transistor TFT formed as described above, and a pixel electrode 28A of the OLED 28 may be formed above the passivation layer 27. The pixel electrode 28A may contact the source electrode 27A of the thin film transistor TFT via a via hole H2 formed in the passivation layer 27. The passivation layer 27 may include a single layer or two or more layers including an inorganic material and/or an organic material. While the passivation layer 27 may be formed as a planarization layer to planarize a surface arranged above the planarization layer, regardless of a curve of a layer arranged below the planarization layer, the passivation layer 27 may also be formed to have a curve according to a curve of a layer arranged below the planarization layer. Also, the passivation layer 27 may be formed as a transparent insulator to achieve a resonance effect.

After the pixel electrode 28A is formed on the passivation layer 27, a pixel-defining layer 29 including an organic material and/or an inorganic material may be formed to cover the pixel electrode 28A and the passivation layer 27. The pixel-defining layer 29 may have an opening to expose the pixel electrode 28A.

Also, an intermediate layer 28B and the opposite electrode 28C may be formed at least on the pixel electrode 28A. According to an embodiment, the opposite electrode 28C may be formed on the entire surface of the display substrate D. In this case, the opposite electrode 28C may be formed on the intermediate layer 28B and the pixel-defining layer 29. Hereinafter, for convenience of explanation, a case in which the opposite electrode 28C is formed on the intermediate layer 28B and the pixel-defining layer 29 will be primarily described in detail.

The pixel electrode 28A may function as an anode and the opposite electrode 28C may function as a cathode. However, the polarities thereof may be the opposite.

The pixel electrode 28A and the opposite electrode 28C may be insulated from each other via the intermediate layer 28B, and voltages of different polarities may be applied to the intermediate layer 28B for emission from an organic emission layer.

The intermediate layer 28B may include the organic emission layer. As another selective example, the intermediate layer 28B may include the organic emission layer, and may further include at least one of a hole injection layer (HIL), a hole transport layer (HTL), an electron transport layer (ETL), and an electron injection layer (EIL), in addition to the organic emission layer. The present embodiment is not limited thereto. The intermediate layer 28B may include the organic emission layer and may further include various other functional layers.

The intermediate layer 28B may be provided in a multiple number and the plurality of intermediate layers 28B may form the display area D. Here, the plurality of intermediate layers 28B may be arranged in the display area D to be apart from each other.

A unit pixel may include a plurality of sub-pixels, which may emit light of various colors. For example, the plurality of sub-pixels may include sub-pixels each emitting red light, green light, or blue light or sub-pixels each emitting red light, green light, blue light, or white light.

The apparatus 1 for manufacturing the display device illustrated in FIG. 1 may form various layers on the display substrate D. For example, the apparatus 1 for manufacturing the display device may form at least one of the layers of the intermediate layer 28B on the display substrate D. For example, the apparatus 1 for manufacturing the display device may form at least one of the organic emission layer, the HIL, the HTL, the EIL, the ETL, or the functional layers of the intermediate layer 28B.

An upper layer including an organic material may be formed on the opposite electrode 28C described above. Here, the upper layer may be arranged between an encapsulation substrate to be described below and the opposite electrode 28C or between the encapsulation layer E and the opposite electrode 28C.

The upper layer may be arranged to protect the opposite electrode 28C and increase the light extraction efficiency. The upper layer may include an organic material having a higher refractive index than an organic material of the opposite electrode 28C. Alternatively, the upper layer may include stacked layers having different refractive indices. For example, the upper layer may be formed by including a high refractive index layer, a low refractive index layer, and a high refractive index layer that are stacked. Here, a refractive index of the high refractive index layer may be about equal to or higher than 1.7 and a refractive index of the low refractive index layer may be about equal to or lower than 1.3.

The upper layer may additionally include lithium fluoride (LiF). Alternatively, the upper layer may additionally include an inorganic insulating material, such as silicon oxide ($SiO_x$), silicon nitride ($SiN_x$), or the like.

The encapsulation layer E may include a plurality of inorganic encapsulation layers, or an inorganic encapsulation layer and an organic encapsulation layer.

The organic encapsulation layer of the encapsulation layer E may include a polymer-based material. The polymer-based material may include an acryl-based resin, an epoxy-based resin, polyimide, polyethylene, or the like.

The inorganic encapsulation layer of the encapsulation layer E may include at least one inorganic insulating material among aluminum oxide, titanium oxide, tantalum oxide, hafnium oxide, zinc oxide, silicon oxide, silicon nitride, and silicon oxynitride.

An uppermost layer E3 of the encapsulation layer E, which is exposed to the outside, may be formed as an inorganic encapsulation layer to prevent penetration of moisture into the OLED 28.

The encapsulation layer E may include at least one sandwich structure in which at least one organic encapsulation layer E2 is inserted between at least two inorganic encapsulation layers E3 and E1. As another example, the encapsulation layer E may include at least one sandwich structure in which at least one inorganic encapsulation layer E1 is inserted between at least two organic encapsulation layers E2 and E2'. As another example, the encapsulation layer E may include a sandwich structure in which at least one organic encapsulation layer E2 is inserted between at least two inorganic encapsulation layers E1 and E3 and a sandwich structure in which at least one inorganic encapsulation layer E1' is inserted between at least two organic encapsulation layers E2' and E2".

The encapsulation layer E may sequentially include the first inorganic encapsulation layer E1, the first organic encapsulation layer E2, and the second inorganic encapsulation layer E3 above the OLED 28, but is not limited thereto.

As another example, the encapsulation layer E may sequentially include a first inorganic encapsulation layer, a first organic encapsulation layer, a second inorganic encapsulation layer, a second organic encapsulation layer, and a third inorganic encapsulation layer above the OLED 28.

As another example, the encapsulation layer E may sequentially include a first inorganic encapsulation layer, a first organic encapsulation layer, a second inorganic encapsulation layer, a second organic encapsulation layer, a third inorganic encapsulation layer, a third organic encapsulation layer, and a fourth inorganic encapsulation layer above the OLED 28. Here, the first organic encapsulation layer may have less area than the second inorganic encapsulation layer, and the second organic encapsulation layer may have less area than the third inorganic encapsulation layer.

When the plurality of the inorganic encapsulation layers are disposed as described above, the inorganic encapsulation layers may be deposited at an edge area of the display substrate 20 to directly contact one another and may prevent the exposure of the organic encapsulation layers to the outside.

Thus, the display device 20 may realize a precise image.

As described above, according to the one or more of the above embodiments, the apparatus for manufacturing the display device and the method of manufacturing the display device may manufacture a display device having an increased lifespan.

Also, the apparatus for manufacturing the display device and the method of manufacturing the display device may avoid discard of the display device due to manufacturing defects, and may reduce manufacturing time and increase manufacturing efficiency.

It shall be understood that exemplary embodiments described herein have been presented and should be considered in a descriptive sense rather than for purposes of limitation. Descriptions of details within each embodiment may typically be considered as available for other embodiments unless stated otherwise. While exemplary embodiments have been described with reference to the figures, it will be understood by those of ordinary skill in the pertinent art that various changes in form and details may be made therein without departing from the spirit and scope of the present disclosure as defined by the following claims.

What is claimed is:

1. An apparatus for manufacturing a display device, the apparatus comprising:
   a mounting unit configured to receive a display substrate;
   an inspection unit movably arranged on the mounting unit and configured to inspect a portion of an organic encapsulation layer of the display substrate to determine whether it is a defective portion, wherein the inspection unit is configured to detect a three-dimensional shape including voids and protrusions of the defective portion; and a repair unit movably arranged on the mounting unit and configured to repair the detective portion based on the detected three-dimensional shape, including to remove material from a detected protrusion of the defective portion and to supply an organic material to a defective void of the defective portion.

2. The apparatus of claim 1, further comprising:
at least one gantry movably arranged on the mounting unit, and movable in first and second directions substantially parallel to the display substrate,
wherein the inspection unit is movably arranged on the at least one gantry,
wherein the inspection unit is configured to optically inspect whether the portion of the organic encapsulation layer of the display substrate has the defective portion,
wherein the repair unit is movably arranged on the at least one gantry, further movable in a third direction substantially perpendicular to the display substrate, and configured to alternately remove at least an impurity or protrusion of the defective portion and supply an organic material to fill a void of the defective portion to a level substantially coplanar with the organic encapsulation layer.

3. The apparatus of claim 1, wherein the repair unit is further configured to supply the organic material to the defective portion of the organic encapsulation layer so as to adjust a taper angle of the defective portion of the organic encapsulation layer.

4. The apparatus of claim 1, wherein the repair unit is further configured to remove the defective portion of the organic encapsulation layer, the defective portion protruding from a surface of the organic encapsulation layer.

5. The apparatus of claim 1, wherein the inspection unit and the repair unit are movable in a first direction and a second direction substantially parallel to the display substrate, and movable relative to each other in a third direction substantially perpendicular to the display substrate.

6. The apparatus of claim 1, wherein the repair unit includes at least one of a slit coater configured to supply the organic material or an impurity remover configured to remove the defective portion protruding from the organic encapsulation layer.

7. A method of manufacturing a display device, the method comprising:
mounting a display substrate including a first inorganic encapsulation layer, on which an organic encapsulation layer on the first inorganic encapsulation layer is arranged;
optically inspecting whether or not the organic encapsulation layer is defective;
detecting a three-dimensional shape of a defective portion; and
supplying an organic material to the defective portion of the organic encapsulation layer to a level substantially coplanar with the organic encapsulation layer.

8. The method of claim 7, further comprising forming an inorganic encapsulation layer on the organic encapsulation layer.

9. The method of claim 7, wherein the defective portion has a shape, in which the defective portion protrudes from a surface of the organic encapsulation layer.

10. The method of claim 9, further comprising adjusting a taper angle formed by the surface of the organic encapsulation layer and an outer surface of the defective portion, by supplying the organic material to the defective portion protruding from the surface of the organic encapsulation layer.

11. The method of claim 7, wherein the defective portion has a form of a groove engraved in a surface of the organic encapsulation layer.

12. The method of claim 11, further comprising supplying the organic material to the defective portion to make the surface of the organic encapsulation layer and an entire surface of the defective portion coplanar.

13. The method of claim 11, further comprising controlling, according to a shape of the groove, an amount of the organic material supplied to the groove.

14. The method of claim 7, wherein the organic material includes substantially the same material as the organic encapsulation layer, less any detected impurities.

15. A method of manufacturing a display device, the method comprising:
mounting a display substrate including a first inorganic encapsulation layer, on which an organic encapsulation layer on the first inorganic encapsulation layer is arranged;
optically inspecting whether or not impurities protrude from a surface of the organic encapsulation layer and detecting their three-dimensional shapes; and
removing a protruding portion of the impurities from the surface of the organic encapsulation layer to a level substantially coplanar with the organic encapsulation layer based on their detected three-dimensional shapes.

16. The method of claim 15, further comprising forming an inorganic encapsulation layer on the organic encapsulation layer.

17. The method of claim 15, wherein an entire upper surface of the impurities and an upper surface of the organic encapsulation layer are coplanar.

18. The method of claim 15, further comprising coating the impurities with an organic material.

19. The method of claim 18, wherein the organic material includes the substantially the same material as the organic encapsulation layer, less any detected impurities.

20. The method of claim 15, wherein a portion of the impurities is present in the organic encapsulation layer.

21. A manufacturing apparatus comprising:
an alignment stage configured to receive a semiconductor substrate;
an image sensor movably arranged on the alignment stage and configured to detect a defective portion in an encapsulation layer disposed on the semiconductor substrate; and
a repair actuator movably arranged on the alignment stage and configured to repair the detected defective portion in the encapsulation layer,
wherein the image sensor is configured to detect a three-dimensional shape of the detected defective portion including voids or protrusions, and the repair actuator is configured to repair the detected defective portion including voids or protrusions to a level substantially coplanar with the encapsulation layer based on the detected three-dimensional shape.

22. The apparatus of claim 21, further comprising:
at least one gantry movably arranged on the alignment stage, and movable in first and second directions substantially parallel to the semiconductor substrate; and
an inkjet actuator movably arranged on the at least one gantry and configured to form the encapsulation layer by supplying an encapsulating layer of material on the semiconductor substrate, wherein the image sensor is movably arranged on the at least one gantry, wherein the repair actuator is movably arranged on the at least one gantry, independently movable perpendicular to the semiconductor substrate, and configured to repair a surface of the detected defective portion to a level substantially coplanar with the organic encapsulation layer based on the detected three-dimensional shape.

23. The apparatus of claim 21, wherein the alignment stage comprises at least one linear actuator configured to move in a direction based on a crystal orientation of at least one of the semiconductor substrate or the encapsulation layer.

24. The apparatus of claim 21, wherein the repair actuator comprises an impurity remover configured to remove a portion of the encapsulation layer at a location of the defective portion.

25. The apparatus of claim 21, wherein the repair actuator comprises a slit coater configured to supply a repair material at a location of the defective portion within the encapsulation layer.

* * * * *